(12) United States Patent
Chun et al.

(10) Patent No.: US 10,475,864 B2
(45) Date of Patent: Nov. 12, 2019

(54) DISPLAY COMPONENT

(71) Applicant: WUHAN CHINA STAR OPTOELECTRONICS SEMICONDUCTOR DISPLAY TECHNOLOGY CO., LTD., Wuhan, Hubei (CN)

(72) Inventors: Pilgeun Chun, Hubei (CN); Liang Sun, Hubei (CN); Peng Mao, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/575,467

(22) PCT Filed: Oct. 27, 2017

(86) PCT No.: PCT/CN2017/107999
§ 371 (c)(1),
(2) Date: Nov. 20, 2017

(87) PCT Pub. No.: WO2019/037236
PCT Pub. Date: Feb. 28, 2019

(65) Prior Publication Data
US 2019/0067386 A1 Feb. 28, 2019

(30) Foreign Application Priority Data

Aug. 25, 2017 (CN) .......................... 2017 1 0739318

(51) Int. Cl.
*H01L 27/32* (2006.01)
*H01L 51/52* (2006.01)
(Continued)

(52) U.S. Cl.
CPC ........ *H01L 27/3237* (2013.01); *G06F 1/1626* (2013.01); *H01L 51/0097* (2013.01); *H01L 51/524* (2013.01); *H01L 2251/5338* (2013.01)

(58) Field of Classification Search
CPC ............... H01L 27/3237; H01L 51/524; H01L 51/0097; H01L 2251/5338
(Continued)

(56) References Cited

U.S. PATENT DOCUMENTS

| 9,618,974 B2 | 4/2017 | Choi et al. | |
| 2007/0182663 A1* | 8/2007 | Biech | .................... G06F 1/1618 345/1.1 |

(Continued)

FOREIGN PATENT DOCUMENTS

| CN | 104424851 A | 3/2015 |
| CN | 204331666 U | 5/2015 |

(Continued)

*Primary Examiner* — Thinh T Nguyen
(74) *Attorney, Agent, or Firm* — Kirton McConkie; Evan R. Witt

(57) ABSTRACT

A display component is provided. The display component has a flexible display panel, a first glass substrate, and a second glass substrate. The flexible display panel includes a first display portion, a second display portion, and a bending portion. The bending portion connects the first display portion and the second display portion. The first glass substrate covers a first light emitting surface of the first display portion, and the second glass substrate covers a second light emitting surface of the second display portion.

10 Claims, 6 Drawing Sheets

(51) Int. Cl.
*H01L 51/00* (2006.01)
*G06F 1/16* (2006.01)

(58) Field of Classification Search
USPC .................. 257/40, 59, 72, 91; 438/82, 99
See application file for complete search history.

(56) References Cited

U.S. PATENT DOCUMENTS

| | | | |
|---|---|---|---|
| 2014/0042406 A1* | 2/2014 | Degner et al. | H01L 27/326 257/40 |
| 2014/0049500 A1* | 2/2014 | Chen et al. | G02F 1/1333 245/174 |
| 2015/0255023 A1 | 9/2015 | Lee et al. | |
| 2016/0048171 A1 | 2/2016 | Lee et al. | |
| 2016/0147263 A1* | 5/2016 | Choi et al. | G06F 1/1562 361/679.3 |
| 2016/0209874 A1* | 7/2016 | Choi et al. | G06F 1/1641 |
| 2016/0338219 A1* | 11/2016 | Seo et al. | H05K 7/16 |
| 2017/0239771 A1* | 8/2017 | Park et al. | B24B 7/10 |
| 2018/0095502 A1* | 5/2018 | Yamazaki et al. | G06F 1/1652 |
| 2018/0217433 A1 | 8/2018 | Tang | |

FOREIGN PATENT DOCUMENTS

| | | |
|---|---|---|
| CN | 104900152 A | 9/2015 |
| CN | 105974632 A | 9/2016 |

* cited by examiner

DISPLAY COMPONENT

FIELD OF INVENTION

The present disclosure relates to a technical field of displays, and in particular to a bezel-less and foldable display component of organic Light emitting diodes (OLEDs).

BACKGROUND OF INVENTION

With the internet market, virtual reality (VR), and augmented reality (AR) all increasing, foldable OLED display components have entered a period of rapid growth. However, conflict between screen size and portability has become increasingly prominent in prior art. Therefore, an improved design of a bezel-less and foldable display component can solve problems existing in conventional technologies.

SUMMARY OF INVENTION

An object of the present disclosure is to provide a foldable OLED display component.

A display component is provided, which comprises: a flexible display panel comprising a first display portion, a second display portion, and a bending portion, wherein the bending portion is connected to the first display portion and the second display portion, the first display portion comprises a first light emitting surface and a first light-shielding surface arranged opposite to the first light emitting surface, and the second display portion comprises a second light emitting surface and a second light-shielding surface arranged opposite to the second light emitting surface; a first glass substrate covering the first light emitting surface of the first display portion; and a second glass substrate covering the second light emitting surface of the second display portion.

In one embodiment of the present disclosure, a void is formed between the first glass substrate and the second glass substrate.

In one embodiment of the present disclosure, the first glass substrate and the second glass substrate are connected to each other, and the bending portion protrudes in a direction away from the first glass substrate and the second glass substrate.

In one embodiment of the present disclosure, the bending portion is bent when the display component is a folded state.

In one embodiment of the present disclosure, the first display portion and the second display portion are folded in relation to the bending portion, and the first light-shielding surface and the second light-shielding surface are attached.

In one embodiment of the present disclosure, the first display portion and the second display portion are folded in relation to the bending portion, and the first light emitting surface and the second light emitting surface are attached.

In one embodiment of the present disclosure, the display component further comprises a driving chip, and the first display portion and the second display portion are electrically connected to the driving chip.

In one embodiment of the present disclosure, the driving chip is disposed on a bending portion of the flexible display panel, and the driving chip is disposed on a surface of the bending portion facing the first glass substrate and the second glass substrate.

In one embodiment of the present disclosure, the driving chip is disposed on a bending portion of the flexible display panel, and the driving chip is disposed on a surface of the bending portion away from the first glass substrate and the second glass substrate.

In one embodiment of the present disclosure, the driving chip is disposed on a first display portion of the flexible display panel, and the driving chip is disposed on a surface of the first display portion away from the first glass substrate.

In one embodiment of the present disclosure, the bending portion is C-shaped, and located at a side of the flexible display panel.

In one embodiment of the present disclosure, the bending portion is stretched when the display component is an unfolded state.

In one embodiment of the present disclosure, the bending portion is bent when the display component is an unfolded state.

In one embodiment of the present disclosure, an angle is formed between the first glass substrate and the second glass substrate.

A display component is provided, which comprises a flexible display panel comprising a first display portion, a second display portion, and a bending portion, wherein the first display portion comprises a first light emitting surface and a first light-shielding surface arranged opposite to the first light emitting surface, and the second display portion comprises a second light emitting surface and a second light-shielding surface arranged opposite to the second light emitting surface; a first glass substrate covering the first light emitting surface of the first display portion; and a second glass substrate covering the second light emitting surface of the second display portion, the bending portion is bent, the first glass substrate and the second glass substrate connect to each other, and the bending portion protrudes in a direction away from the first glass substrate and the second glass substrate.

In one embodiment of the present disclosure, the display component further comprises a driving chip, and the first display portion and the second display portion electrically connect the driving chip.

In one embodiment of the present disclosure, the driving chip is disposed on a bending portion of the flexible display panel, and the driving chip is disposed on a surface of the bending portion toward facing the first glass substrate and the second glass substrate.

In one embodiment of the present disclosure, the driving chip is disposed on a bending portion of the flexible display panel, and the driving chip is disposed on a surface of the bending portion toward going away the first glass substrate and the second glass substrate.

In one embodiment of the present disclosure, the driving chip is disposed on a first display portion of the flexible display panel, and the driving chip is disposed on a surface of the first display portion away the first glass substrate.

The beneficial effect of the present disclosure compared with the prior art is that the electrodes of the folded section are made of a material with a bending resistance in the flexible touch display panel, so that the bending stress of the electrodes at the folded portion of the flexible touch display panel can be improved, and the service life of the flexible touch display panel can be increased, thereby solving the problems of the flexible touch screen of the prior air comprising low bending resistance, defective wiring caused by deformation, and poor product quality.

DETAILED DESCRIPTION OF THE PREFERRED EMBODIMENTS

An embodiment of the present disclosure provides a display component 10.

Figure 1:
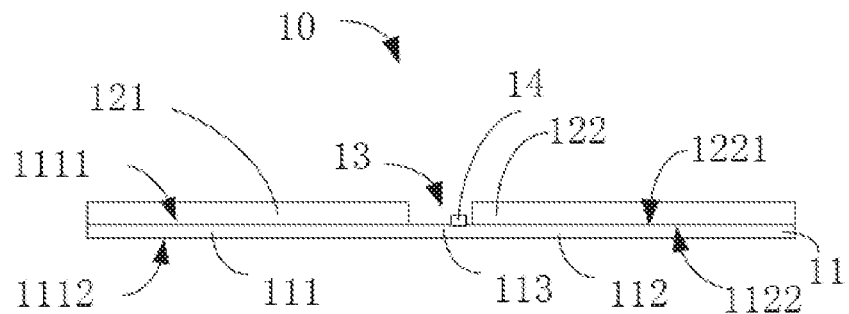
FIG. 1 is a side view of a display component according an embodiment of the present disclosure in a first usage status.
Figure 2:
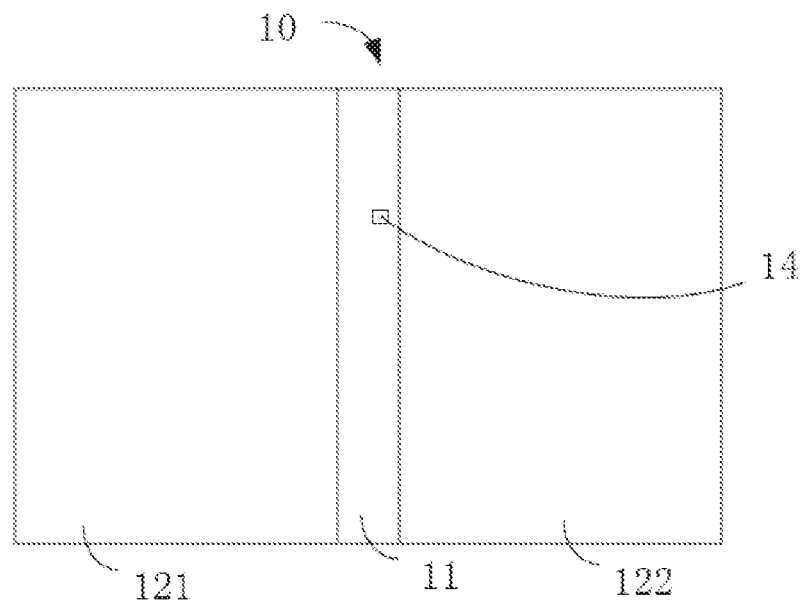
FIG. 2 is a front view of the display component of FIG. 1 in the usage status.
Figure 3:
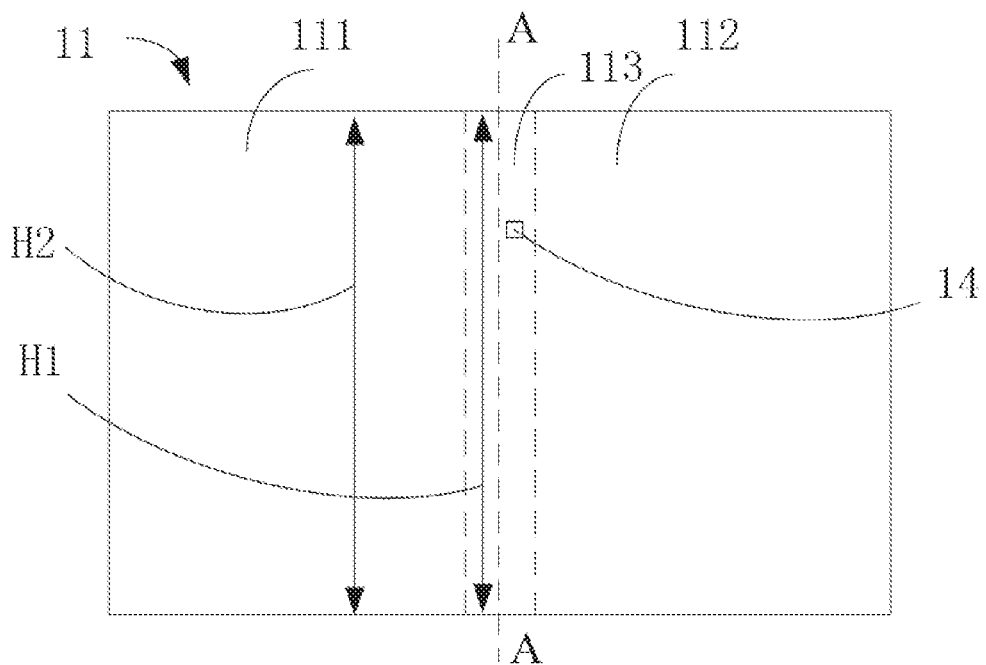
FIG. 3 is a front view of the flexible display panel of the display component of FIG. 1 in a first implementation method.

Referring to FIGS. 1 to 3, the display component 10 comprises a flexible display panel 11, a first glass substrate 121, and a second glass substrate 122.

The flexible display panel 11 comprises a first display portion 111, a second display portion 112, and a bending portion 113, wherein the bending portion 113 is connected between the first display portion 111 and the second display portion 112, and electrically connects the first display portion 111 and the second display portion 112. In some embodiments, a bending radius of the bending portion 113 is less than 1 mm.

Referring to FIG. 3, the bending portion 113 is connected between the first display portion 111 and the second display portion 112, and electrically connects the first display portion 111 and the second display portion 112. A width H1 of the bending portion 113 is equal to a width of the first display portion 111.

Figure 4:
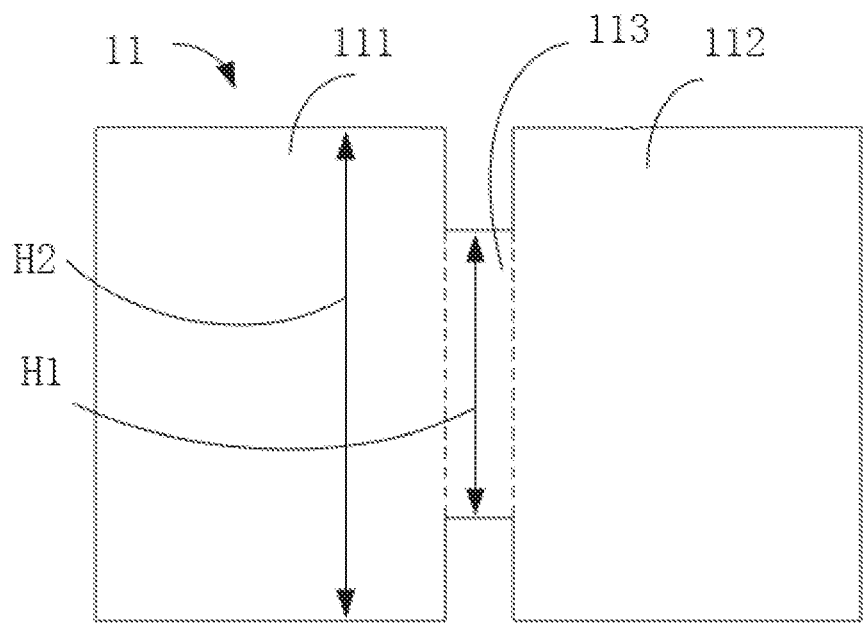
FIG. 4 is a front view of the flexible display panel of the display component of FIG. 1 in a second implementation method.

Referring to FIG. 4, the bending portion 113 is connected between the first display portion 111 and the second display portion 112, and electrically connects the first display portion 111 and the second display portion 112. A width H1 of the bending portion 113 is less than a width of the first display portion 111. Thus, the stress is reduced during bending to increase flexibility.

Figure 5:
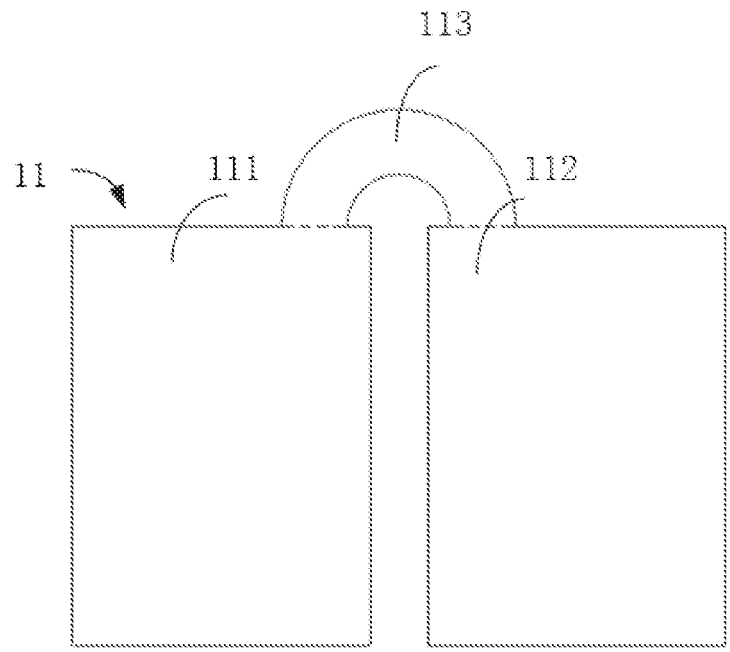
FIG. 5 is a front view of the flexible display panel of the display component of FIG. 1 in a third implementation method.

Referring to FIG. 5, the bending portion 113 is connected between the first display portion 111 and the second display portion 112, and located at a side of the flexible display panel 11. The bending portion 113 electrically connects the first display portion 111 and the second display portion 112. The bending portion 113 is C-shaped. An end of the bending portion 113 connects to a side of the first display portion 111, another end of the bending portion 113 is connected to a side of the second display portion 112. The bending portion 113 is located at a side of the flexible display panel 11 so that the stress is reduced during bending, and the first display portion 111 and the second display portion 112 can be rotated to increase flexibility.

The first display portion 111 comprises a first light emitting surface 1111 and a first light-shielding surface 1112 arranged opposite to the first light emitting surface 1111. The second display portion 112 comprises a second light emitting surface 1121 and a second light-shielding surface 1122 arranged opposite to the second light emitting surface 1121.

The first glass substrate 121 covers the first light emitting surface 1111 of the first display portion 111.

The second glass substrate 122 covers the second light emitting surface 1121 of the second display portion 112.

Referring to FIG. 1, in an embodiment, when the display component 10 is an unfolded state, and the bending portion 113 is stretched. A void 13 is formed between the first glass substrate 121 and the second glass substrate 122.

Figure 6:
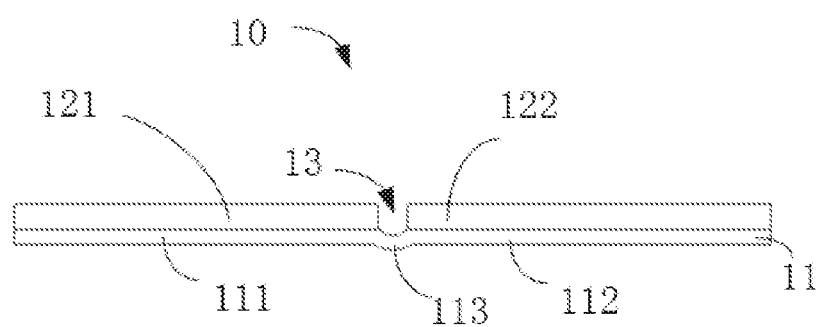
FIG. 6 is a side view of the display component according an embodiment of the present disclosure in a second usage status.

Referring to FIG. 6, in an embodiment, when the display component 10 is an unfolded state, and the bending portion 113 is bent. The void 13 is formed between the first glass substrate 121 and the second glass substrate 122. The bending portion 113 protrudes in a direction away from the first glass substrate 121 and the second glass substrate 122.

Figure 7:
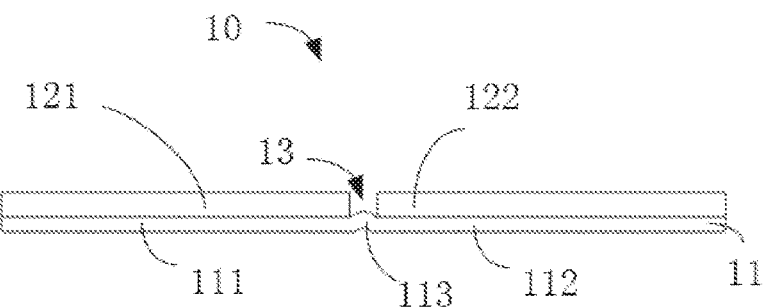
FIG. 7 is a side view of the display component according an embodiment of the present disclosure in a third usage status.

Referring to FIG. 7, in an embodiment, when the display component 10 is an unfolded state, and the bending portion 113 is bent. The void 13 is formed between the first glass substrate 121 and the second glass substrate 122. The bending portion 113 concaves in a direction facing the first glass substrate 121 and the second glass substrate 122.

Figure 8:
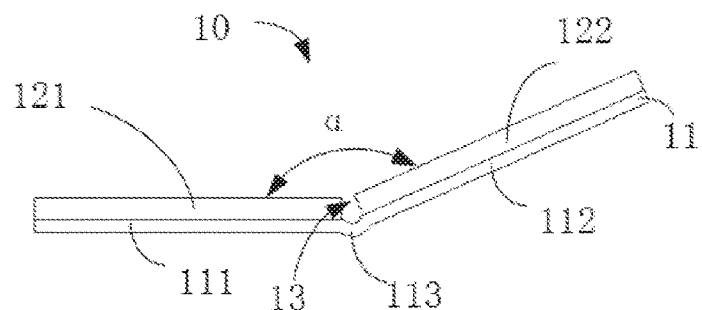
FIG. 8 is a side view of the display component according an embodiment of the present disclosure in a fourth usage status.

Referring to FIG. 8, in an embodiment, when the display component 10 is an unfolded state, and the bending portion 113 is bent. The void 13 is formed between the first glass substrate 121 and the second glass substrate 122. The bending portion 113 protrudes in a direction away from the first glass substrate 121 and the second glass substrate 122, wherein an angle α is formed between the first glass substrate 121 and the second glass substrate 122, and the angle α is less than 180°.

Figure 9:
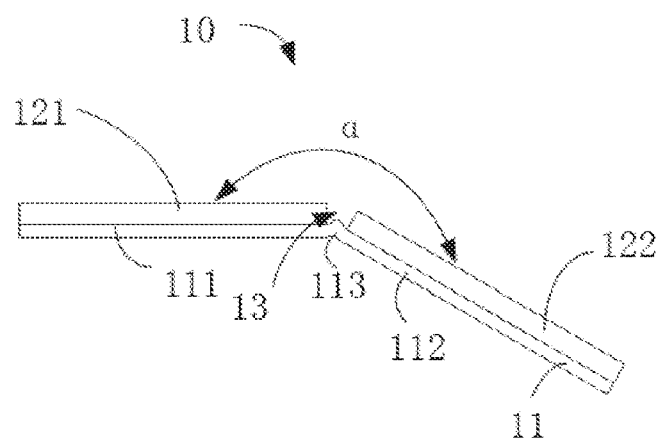
FIG. 9 is a side view of the display component according an embodiment of the present disclosure in a fifth usage status.

Referring to FIG. 9, in an embodiment, when the display component 10 is an unfolded state, and the bending portion 113 is bent. The void 13 is formed between the first glass substrate 121 and the second glass substrate 122. The bending portion 113 concaves in a direction facing the first glass substrate 121 and the second glass substrate 122, wherein an angle α is formed between the first glass substrate 121 and the second glass substrate 122, and the angle α is greater than 180°.

Figure 10:
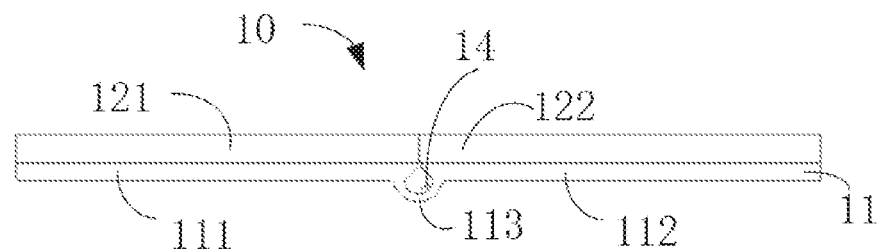
FIG. 10 is a side view of the display component according an embodiment of the present disclosure in a sixth usage status.

Referring to FIG. 10, in an embodiment, when the display component 10 is an unfolded state, and the bending portion 113 is bent. The first glass substrate 121 and the second glass substrate 122 are connected to each other, and the bending portion 113 protrudes in a direction away from the first glass substrate 121 and the second glass substrate 122.

Figure 13:
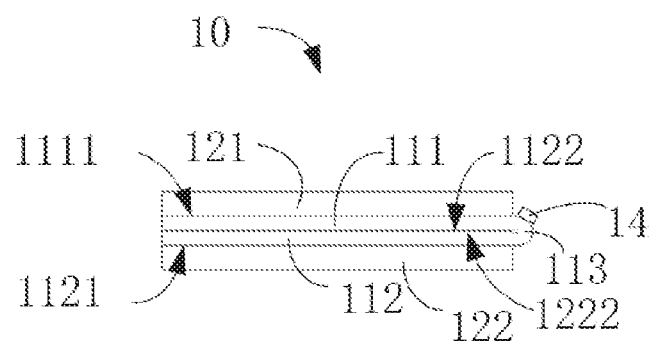
FIG. 13 is a side view of the display component according an embodiment of the present disclosure in a ninth usage status.

Referring to FIG. 13, in an embodiment, when the display component 10 is a folded state, the bending portion 113 is bent. The first display portion 111 and the second display portion 112 are folded in relation to the bending portion 113, and the first light emitting surface 1112 and the second light emitting surface 1122 are attached. The first display portion 111 and the second display portion 112 are parallel, and the first glass substrate 121 and the second glass substrate 122 are parallel. The bending portion 113 is located at a side of the display component 10.

Figure 14:
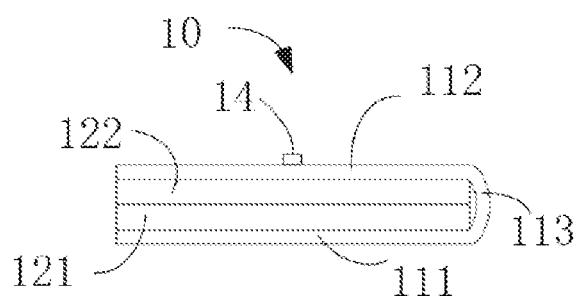
FIG. 14 is a side view of the display component according an embodiment of the present disclosure in a tenth usage status.

Referring to FIG. 14, in an embodiment, when the display component 10 is a folded state, the bending portion 113 is bent. The first display portion 111 and the second display portion 112 are folded in relation to the bending portion 113, and the first glass substrate 121 and the second glass substrate 122 are attached. The first display portion 111 and the second display portion 112 are parallel, and the first glass substrate 121 and the second glass substrate 122 are parallel. The bending portion 113 is located at a side of the display component 10.

Referring to FIGS. 1-3 and 10-14, in an embodiment, the display component 10 further comprises a driving chip 14.

Referring to FIGS. 1-3, the driving chip 14 is disposed on the bending portion 113 of the flexible display panel 10, and the driving chip 14 is disposed on a surface of the bending portion 113 facing the first glass substrate 121 and the second glass substrate 122. The bending portion 113 has a center line A-A, and the driving chip 14 is disposed at a side of the center line A-A to reduce influence of the driving chip 14 for the degree of bending of the bending portion.

Figure 11:
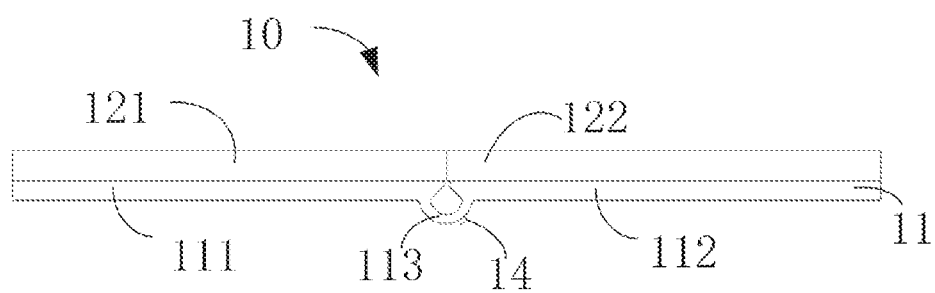
FIG. 11 is a side view of the display component according an embodiment of the present disclosure in a seventh usage status.
Figure 12:
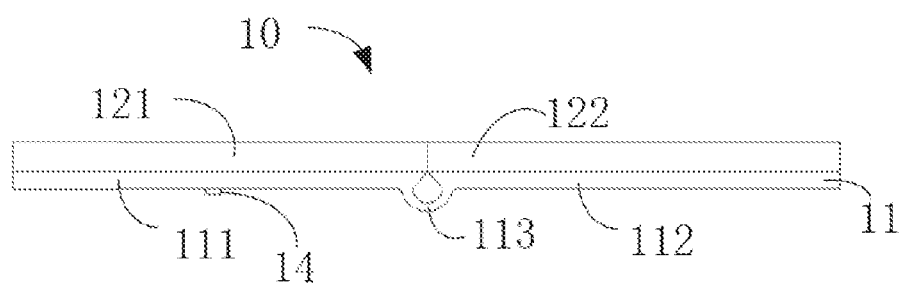
FIG. 12 is a side view of the display component according an embodiment of the present disclosure in an eighth usage status.

Referring to FIG. 10, the driving chip 14 is located at a space surrounded by the bending portion 113. Referring to FIG. 11, the driving chip is also disposed on a surface of the bending portion 113 away the first glass substrate 121 and the second glass substrate 122. The flexible display panel 11 is provided with an electrical connection hole so that the driving chip 14 electrically connects the first display portion 111 and the second display portion 112. Referring to FIG. 12, the driving chip 14 is also disposed on the first display portion 111 of the display component 10, and the driving chip 14 is disposed on a surface of the first display portion 111 way from the first glass substrate 121.

The present disclosure provides the display component 10. The first display portion 111, the second display portion 112, and the bending portion 113 are disposed on the flexible display panel 11 so that the first display portion 111 and the second display portion 112 are bent corresponding to the bending portion 113. Furthermore, the first glass substrate 121 covers the first display portion 111, and the second glass substrate 122 covers the second display portion 122 so that the first glass substrate 121 and the second glass substrate 122 support and protect to the first display portion 111 and the second display portion 122. Thus, a bezel-less and foldable display component 10 can be implemented.

The present disclosure has been described with preferred embodiments thereof and it is understood that many changes and modifications to the described embodiments can be carried out without departing from the scope and the spirit of the invention that is intended to be limited only by the appended claims.

What is claimed is:

1. A display component, comprising:
    a flexible display panel comprising a first display portion, a second display portion, and a bending portion, wherein the bending portion is connected to the first display portion and the second display portion; the first display portion comprises a first light emitting surface and a first light-shielding surface arranged opposite to the first light emitting surface, and the second display portion comprises a second light emitting surface and a second light-shielding surface arranged opposite to the second light emitting surface;
    a first glass substrate covering the first light emitting surface of the first display portion;
    a second glass substrate covering the second light emitting surface of the second display portion; and
    a driving chip disposed on a bending portion of the flexible display panel, and disposed on a surface of the bending portion facing the first glass substrate and the second glass substrate, wherein the first display portion and the second display portion are electrically connected to the driving chip, and wherein a width of the bending portion is less than a width of the first display portion.

2. The display component according to claim 1, wherein a void is formed between the first glass substrate and the second glass substrate.

3. The display component according to claim 2, wherein the first glass substrate and the second glass substrate are connected to each other, and the bending portion protrudes in a direction away from the first glass substrate and the second glass substrate.

4. The display component according to claim 1, wherein the bending portion is bent when the display component is a folded state.

5. The display component according to claim 4, wherein the first display portion and the second display portion are folded in relation to the bending portion, and the first light-shielding surface and the second light-shielding surface are attached.

6. The display component according to claim 4, wherein the first display portion and the second display portion are folded in relation to the bending portion, and the first light emitting surface and the second light emitting surface are attached.

7. The display component according to claim 1, wherein the bending portion is C-shaped, and located at a side of the flexible display panel.

8. The display component according to claim 1, wherein the bending portion is stretched when the display component is an unfolded state.

9. The display component according to claim 1, wherein the bending portion is bent when the display component is an unfolded state.

10. The display component according to claim 1, wherein an angle is formed between the first glass substrate and the second glass substrate.

* * * * *